US012604424B2

(12) United States Patent
Na et al.

(10) Patent No.: US 12,604,424 B2
(45) Date of Patent: Apr. 14, 2026

(54) DISPLAY DEVICE

(71) Applicant: LG ELECTRONICS INC., Seoul (KR)

(72) Inventors: Seokhun Na, Seoul (KR); Kwangho Choi, Seoul (KR); Chulki Kim, Seoul (KR); Hyongil Kil, Seoul (KR); Minook Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 136 days.

(21) Appl. No.: 18/292,752

(22) PCT Filed: Sep. 3, 2021

(86) PCT No.: PCT/KR2021/011923
§ 371 (c)(1),
(2) Date: Jan. 26, 2024

(87) PCT Pub. No.: WO2023/008641
PCT Pub. Date: Feb. 2, 2023

(65) Prior Publication Data
US 2024/0284612 A1     Aug. 22, 2024

(30) Foreign Application Priority Data
Jul. 29, 2021     (KR) ........................ 10-2021-0100025

(51) Int. Cl.
*H05K 5/02*          (2006.01)

(52) U.S. Cl.
CPC ................................. *H05K 5/0217* (2013.01)

(58) Field of Classification Search
CPC ... H05K 5/0217; G06F 1/1652; G06F 1/1637; G06F 1/1601
See application file for complete search history.

(56) References Cited

U.S. PATENT DOCUMENTS

| | | | | |
|---|---|---|---|---|
| 11,567,546 | B2 * | 1/2023 | Kim | G06F 1/181 |
| 2017/0188470 | A1 * | 6/2017 | Cho | H05K 5/03 |
| 2018/0226001 | A1 * | 8/2018 | Chen | G09F 15/0031 |
| 2020/0323087 | A1 * | 10/2020 | Hwang | G06F 1/1652 |
| 2020/0409418 | A1 * | 12/2020 | Yoo | G09F 9/301 |
| 2021/0181797 | A1 * | 6/2021 | Wolff | G06F 1/1601 |
| 2022/0366816 | A1 * | 11/2022 | Oh | F03G 7/064 |

FOREIGN PATENT DOCUMENTS

| | | |
|---|---|---|
| KR | 10-1490301 B1 | 2/2015 |
| KR | 10-2017-0077870 A | 7/2017 |
| KR | 10-1757226 B1 | 7/2017 |
| KR | 10-2021-0056094 A | 5/2021 |
| KR | 10-2021-0067159 A | 6/2021 |

* cited by examiner

*Primary Examiner* — Sagar Shrestha
(74) *Attorney, Agent, or Firm* — Birch, Stewart, Kolasch & Birch, LLP

(57)          ABSTRACT
A display device is disclosed. The display device includes: a flexible display panel; a flexible plate which is disposed at a rear of the display panel, and to which the display panel is coupled; a mount fixed to a rear of the plate; and a bar curved and elongated, and mounted on the mount to be axially rotatable.

9 Claims, 20 Drawing Sheets

FIG. 2

DISPLAY DEVICE

CROSS REFERENCE TO RELATED APPLICATIONS

This application is the National Phase of PCT International Application No. PCT/KR2021/011923, filed on Sep. 3, 2021, which claims priority under 35 U.S.C. 119(a) to Patent Application No. 10-2021-0100025, filed in Republic of Korea on Jul. 29, 2021, all of which are hereby expressly incorporated by reference into the present application.

TECHNICAL FIELD

The following description relates to a display device, and more particularly to a display device capable of changing a curvature of a display panel.

BACKGROUND ART

With the development of the information society, there have been growing demands for various types of display devices, and in order to meet these demands, various display devices, such as a liquid crystal display (LCD), an electroluminescent display (ELD), a vacuum fluorescent display (VFD), an organic light emitting diode (OLED), etc., have been studied and used recently.

Among them, the OLED panel displays an image by using a self-emitting organic layer deposited on a substrate on which transparent electrodes are formed. The OLED panel is not only thin but also has flexible characteristics, and a lot of research has been conducted on the structural characteristics of a display device having the OLED panel.

DISCLOSURE OF INVENTION

Technical Problem

It is an objective of the present disclosure to solve the above and other problems.

It is another objective of the present disclosure to provide a frame structure for freely changing a curvature of a display panel.

It is yet another objective of the present disclosure to provide a mechanism for freely changing a curvature of a display.

Technical Solution

In accordance with an aspect of the present disclosure, the above and other objectives can be accomplished by providing a display device including: a flexible display panel; a flexible plate which is disposed at a rear of the display panel, and to which the display panel is coupled; a mount fixed to a rear of the plate; and a bar curved and elongated, and mounted on the mount to be axially rotatable.

Advantageous Effects of Invention

According to at least one embodiment of the present disclosure, a frame structure for freely changing a curvature of a display panel may be provided.

According to at least one embodiment of the present disclosure, a mechanism for freely changing a curvature of a display may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 20 are diagrams illustrating examples of a display device according to embodiments of the present disclosure.

MODE FOR THE INVENTION

Figure 1:
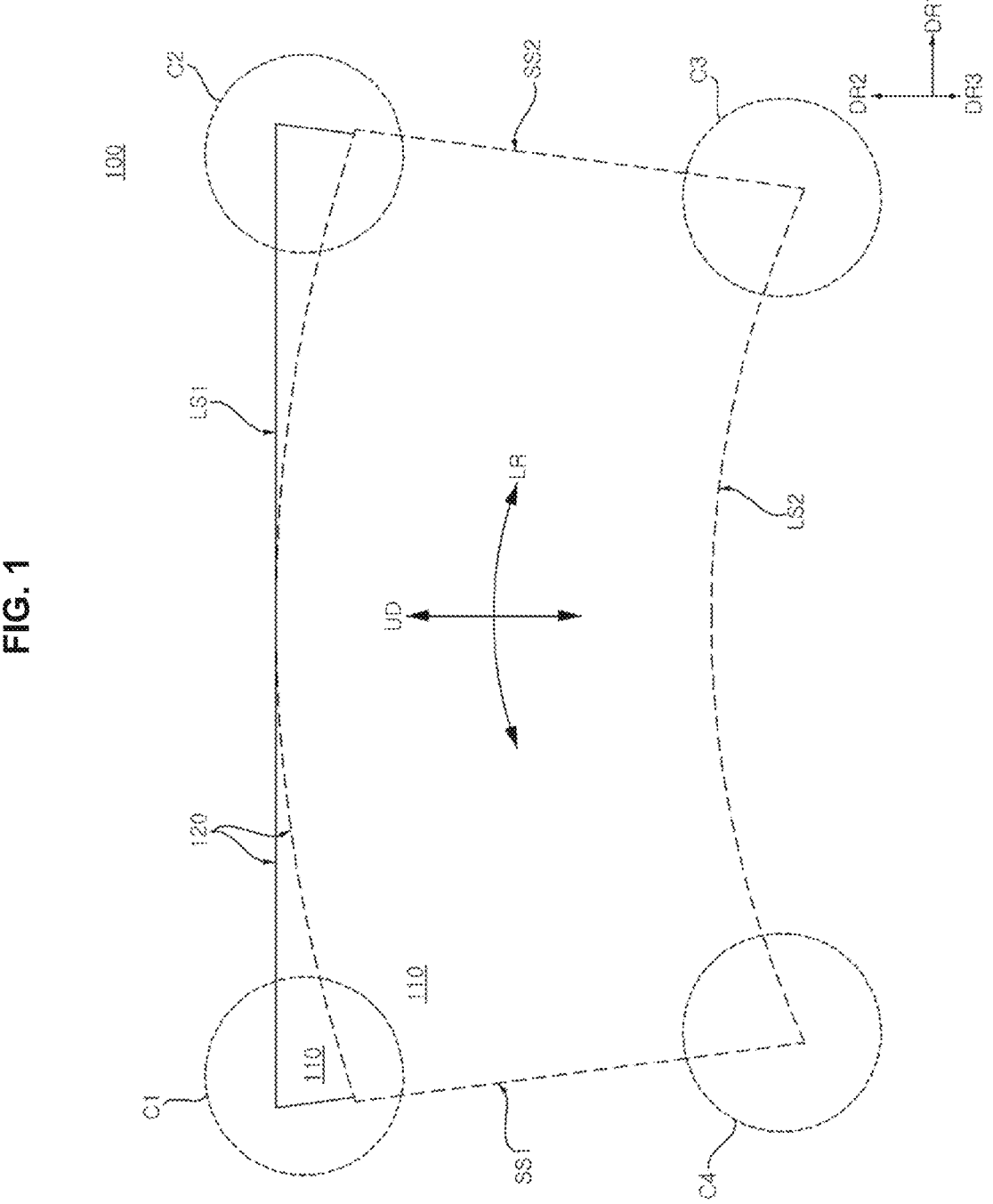

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role. In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

It should be understood that the terms "comprise," "include," "have," etc. when used in this specification, specify the presence of stated features, integers, steps, operations, elements, components, or combinations thereof but do not preclude the presence or addition of one or more other features, integers, steps, operations, elements, components, or combinations thereof.

In the following description, an Organic Light Emitting Diode (OLED) panel will be used as an example of a display panel, but a display panel which is applicable to the present disclosure is not limited to the OLED panel.

In addition, in the following description, the display device may include a first long side LS1, a second long side LS2 opposite to the first long side LS1, a first short side SS1 adjacent to one end of each of the first long side LS1 and the second long side LS2, and a second short side SS2 opposite to the first short side SS1.

Here, an area of the first short side SS1 may be referred to as a first side area, an area of the second short side SS2 may be referred to as a second side area opposite to the first side area, an area of the first long side LS1 may be referred to as a third side area adjacent to the first side area and the second side area and disposed between the first side area and the second side area, and an area of the second long side LS2 may be referred to as a fourth side area adjacent to the first side area and the second side area, disposed between the first side area and the second side area, and opposite to the third side area.

In addition, for convenience of explanation, it is illustrated and described that the first and second long sides LS1 and LS2 are longer than the first and second short sides SS1 and SS2, but it is also possible that the lengths of the first and second long sides LS1 and LS2 may be approximately equal to the lengths of the first and second short sides SS1 and SS2.

Further, in the following description, a first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. Further, the third direction DR3 may be referred to as a vertical direction.

A side or a surface, on which the display device displays an image, may be referred to as a front side or a front surface. When the display device displays an image, a side or a surface, at which the image cannot be observed, may be referred to as a rear side or a rear surface. When the display device is viewed from the front side or the front surface, the first long side LS1 may be referred to as an upper side or an upper surface, and the second long side LS2 may be referred to as a lower side or a lower surface. Likewise, the first short side SS1 may be referred to as a left side or a left surface, and the second short side SS2 may be referred to as a right side or a right surface.

In addition, the first long side LS1, the second long side LS2, the first short side SS1, and the second short side SS2 may be referred to as edges of the display device. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1, a position where the first long side LS1 and the second short side SS2 meet each other may be referred to as a second corner C2, a position where the second short side SS2 and the second long side LS2 meet each other may be referred to as a third corner C3, and a position where the second long side LS2 and the first short side SS1 meet each other may be referred to as a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

Referring to FIG. 1, a plate 120 may be flexible. For example, the plate 120 may be a metal plate. The plate 120 may be referred to as a flexible plate 120, a frame 120, or a module cover 120. The display panel 110 may be disposed on a front side or a front surface of the plate 120. The display panel 110 may be flexible. For example, the display panel 110 may be an OLED panel.

The display panel 110 may be provided on a front surface of a display device 100 and may display an image. The display panel 110 may divide an image into a plurality of pixels and may output the image while controlling color, brightness, and chroma of the respective pixels. The display panel 110 may generate light corresponding to red, green, or blue color in response to a control signal.

The display device 100 may have a variable curvature. The left and right sides of the display device 100 may move forward. For example, when an image is viewed from the front side of the display device 100, the display device 100 may be curved concavely. In this case, the plate 120 may be curved with the same curvature as the display panel 110. Alternatively, the display panel 110 may be curved corresponding to the curvature of the plate 120.

Figure 2:
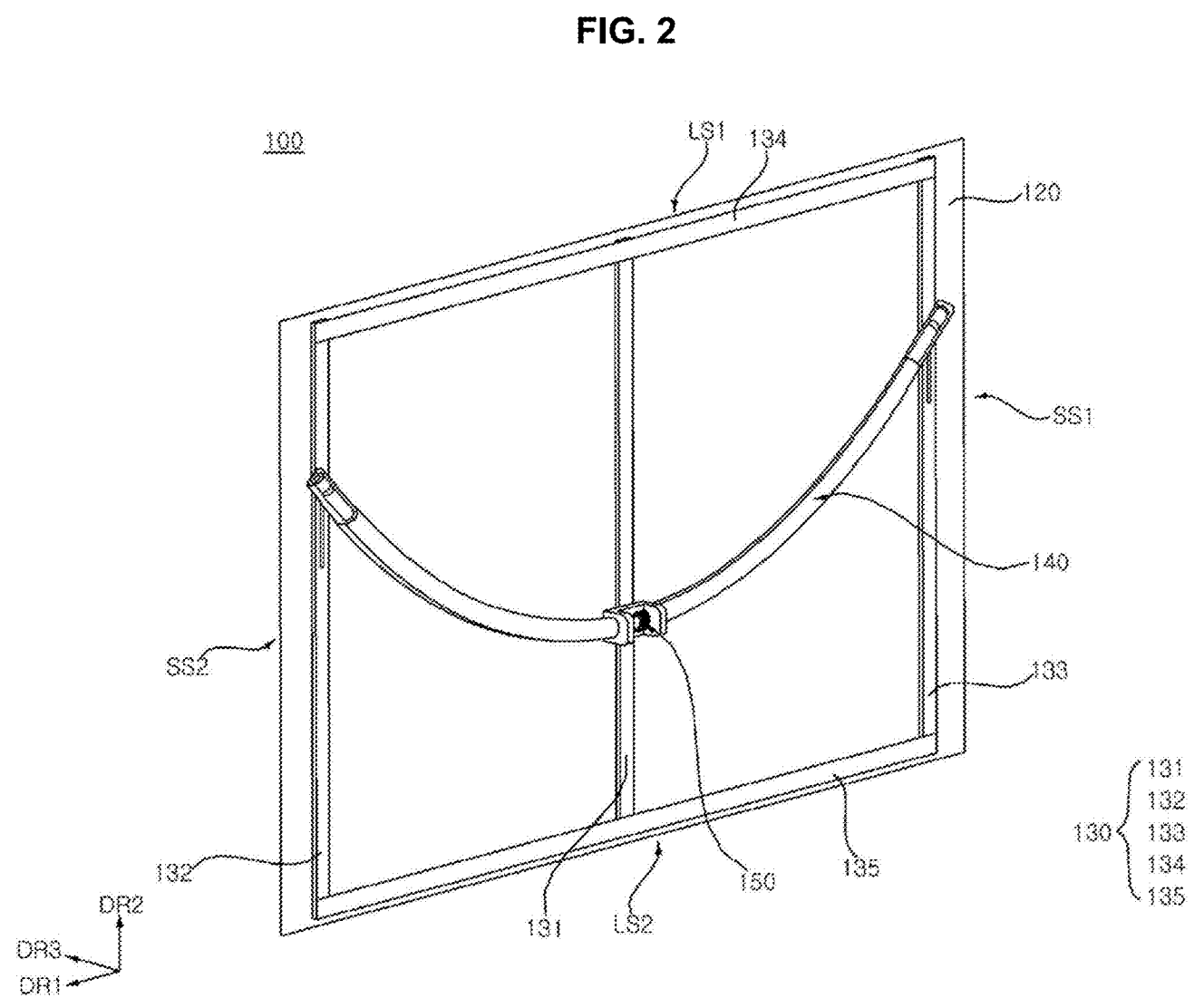
Figure 3:
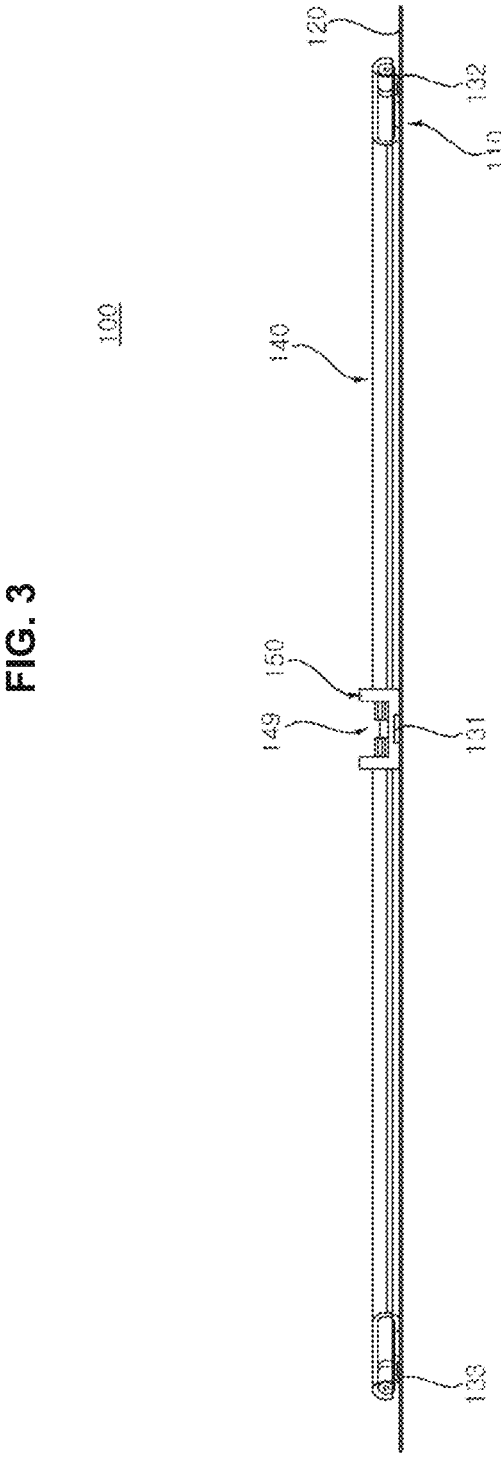
Figure 4:
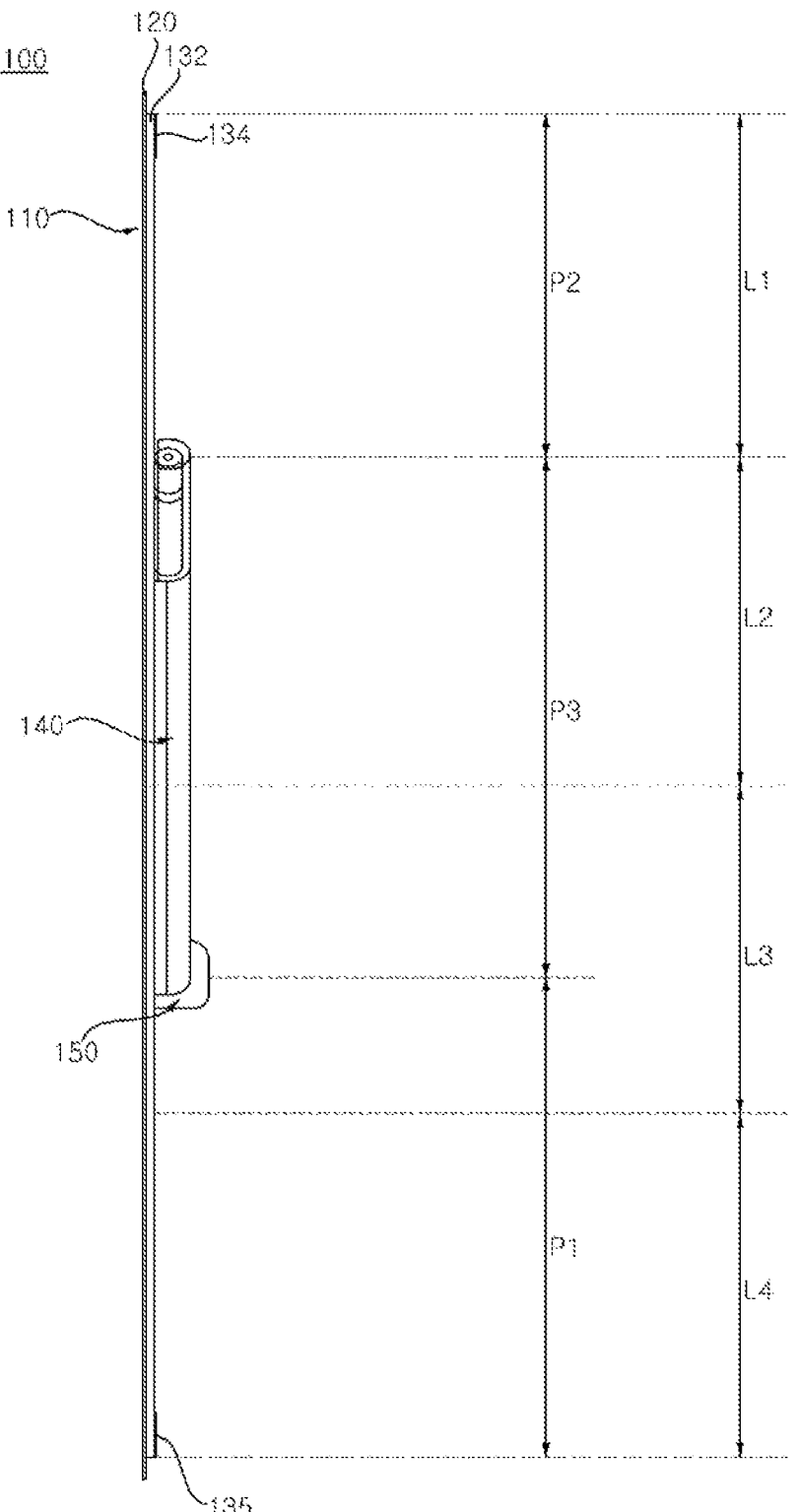

Referring to FIGS. 2 to 4, a rear frame 130 may be coupled to a rear surface of the plate 120. There may be a plurality of rear frames 130. The rear frame 130 may include vertical frames 131, 132, and 133 and horizontal frames 134 and 135. The vertical frames 131, 132, and 133 may include side frames 132 and 133 and a center frame 131. The horizontal frames 134 and 135 may include an upper frame 134 and a lower frame 135.

The center frame 131 may be vertically elongated on the rear surface of the plate 120 and may be coupled or fixed to the center of the plate 120. A first side frame 133 may be adjacent to the first short side SS1 and elongated parallel to the first short side SS1 to be coupled or fixed to the plate 120. A second side frame 132 may be adjacent to the second short side SS2 and elongated parallel to the second short side SS2 to be coupled or fixed to the plate 120. The first side frame 133 may be opposite to the second side frame 132 with respect to the center frame 131.

The upper frame 134 may be adjacent to the first long side LS1 and elongated parallel to the first long side LS1 to be coupled or fixed to an upper side of the plate 120. The lower frame 135 may be adjacent to the second long side LS2 and elongated parallel to the second long side LS2 to be coupled or fixed to a lower side of the plate 120. The upper frame 134 and the lower frame 135 may be flexible.

The center frame 131 may be coupled to the upper frame 134 and/or the lower frame 135. The upper frame 134 and/or the lower frame 135 may be fixed to the center frame 131. The upper frame 134 and/or the lower frame 135 may be coupled to the side frames 132 and 133. The upper frame 134 and/or the lower frame 135 may move with respect to the side frames 132 and 133.

An arc bar 140 may be elongated and curved. The arc bar 140 may have a shape of a portion of a circular arc or a fan shape. The center of the arc bar 140 may be coupled to the center frame 131 to be rotatable with respect to the center frame 131. Both sides of the arc bar 140 may be coupled to the side frames 132 and 133. The center of the arc bar 140 may be disposed at a lower side of the center frame 131. Both ends of the arc bar 140 may be disposed at an upper side of the side frames 132 and 133. The arc bar 140 may be coupled to the center frame 131 by a rotational mount 150. The arc bar 140 may be placed on the center frame 131, and the rotational mount 150 may cover the arc bar 140.

A length of the center frame 131 may be divided into four equal lengths. The length of the center frame 131 may include a first length L1, a second length L2, a third length L3, and a fourth length L4 in a vertical direction of the center frame 131. The center of the arc bar 140 and/or the rotational mount 150 may be located on the third length L3. Both ends of the arc bar 140 may be located on the second length L2. Both ends of the arc bar 140 may also be located on the first length L1 or the second length L2.

A third vertical distance P3 from the center of the arc bar 140 and/or the rotational mount 150 to both ends of the arc bar 140 may be greater than a first distance P1 from a lower end of the center frame 131 to the center of the arc bar 140 and/or the rotational mount 150. A second distance P2 from both ends of the arc bar 140 to an upper end of the center frame 131 may be smaller than the first distance P1.

Figure 5:
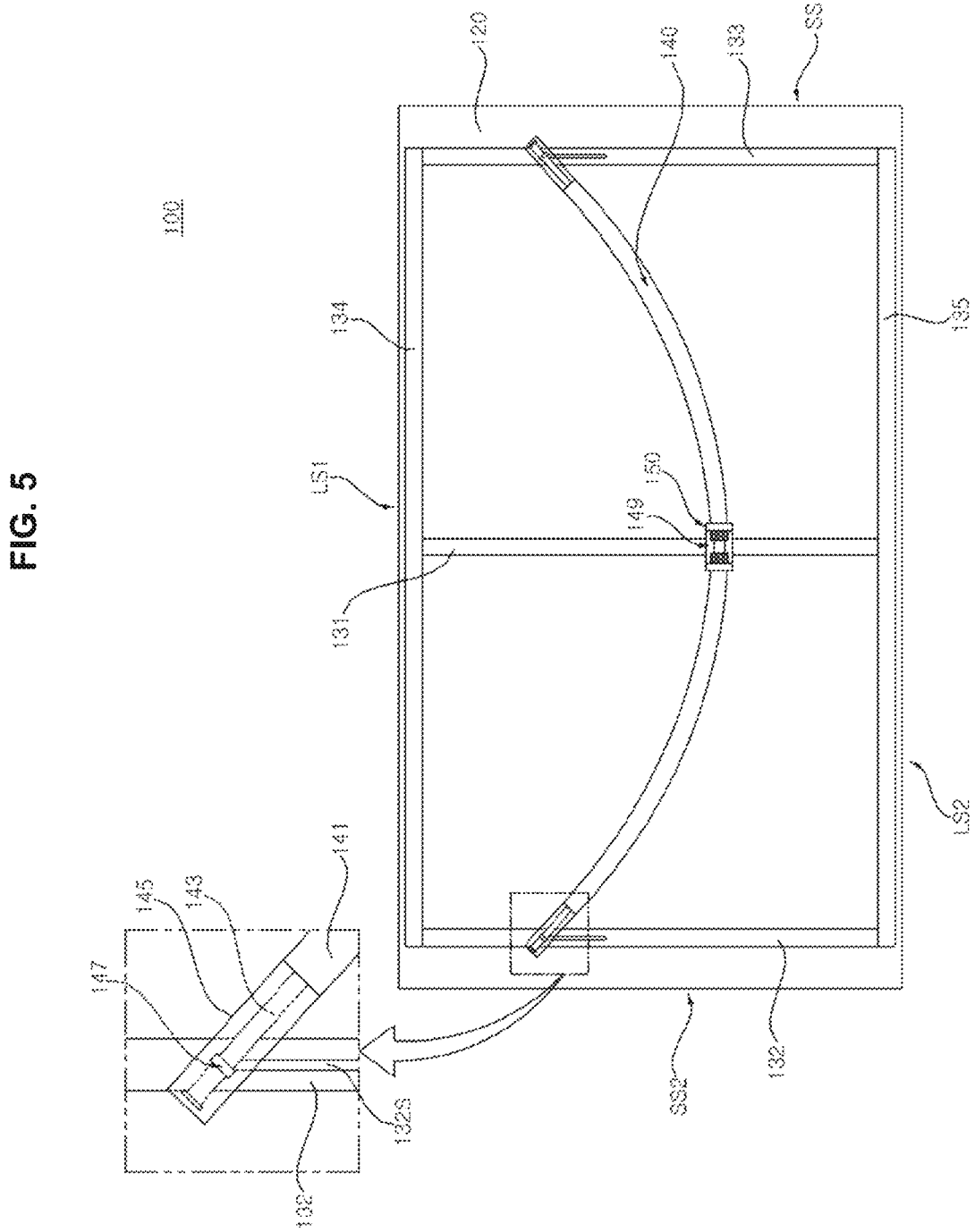

Referring to FIG. 5, the arc bar 140 may include a body 141, a side core 143, a side end 145, a sliding ring 147, and a side cover 145. The body 141 may be elongated and curved. The side core 143 may be formed at both ends of the body 141. A diameter of the side core 143 may be smaller than a diameter of the body 141. A side end 143E (see FIG. 11) may be formed at an end of the side core 143. A diameter of the side end 143E may be greater than the diameter of the side core 143. The side end 143E may be opposite to the body 141 with respect to the side core 143.

The side core 143 may be inserted into the sliding ring 147. The sliding ring 147 is movable on the side core 143. The sliding ring 147 is movable on the side frame 132 and 133. The sliding ring 147 may move upward and downward on a guide slot 132S formed in the side frames 132 and 133. The side cover 145 may cover the side core 143 and/or the side end 143E. The side cover 145 may cover the sliding ring 147, and the sliding ring 147 may move within the side cover 145. The sliding ring 147 may be referred to as a slider 147.

Figure 6:
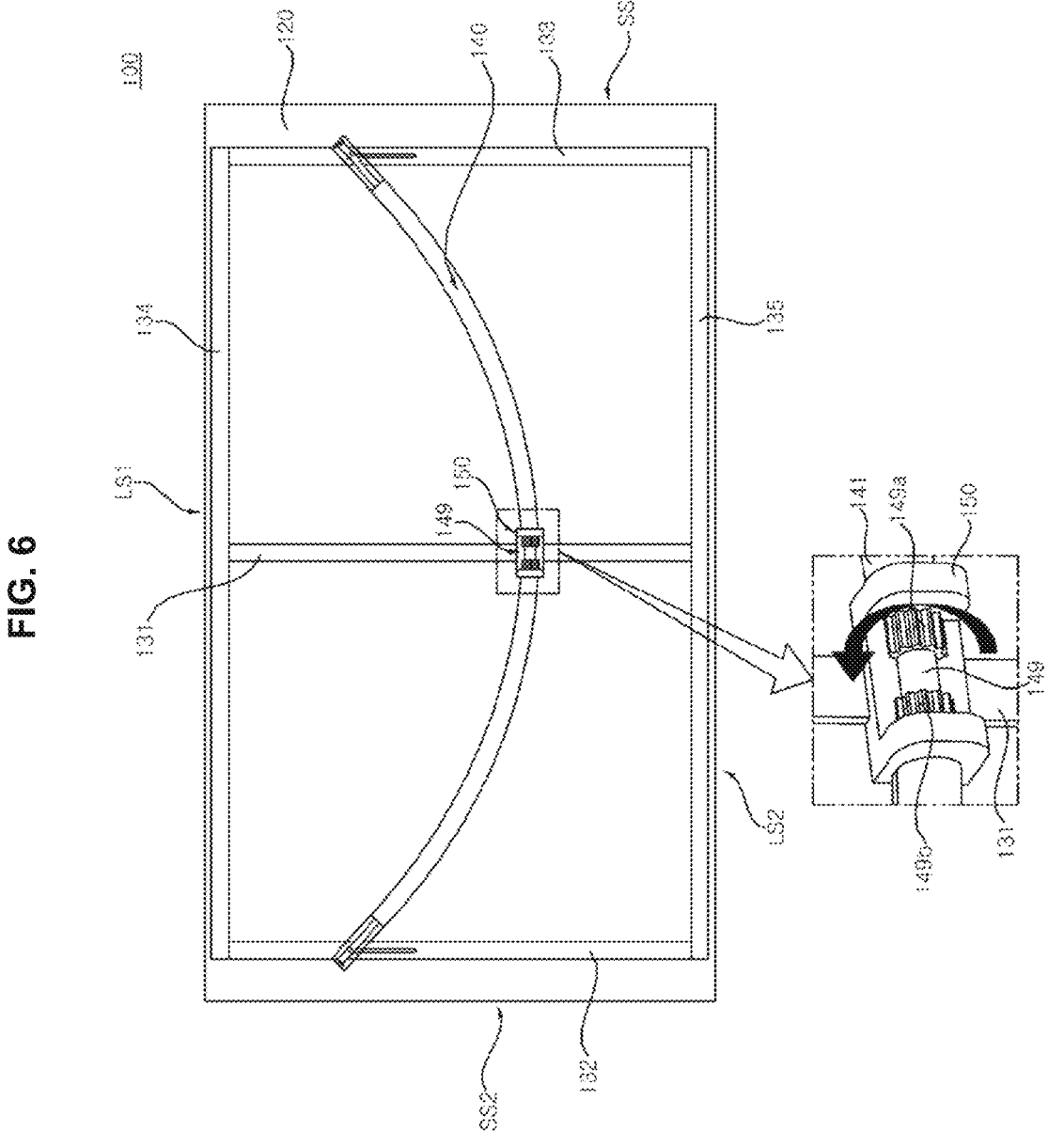

Referring to FIG. 6, the rotational mount 150 may be fixed to the center frame 131. The rotational mount 150 may be a bracket having a generally U-shape. The arc bar 140 may be rotatably mounted on the rotational mount 150. The arc bar 140 may include a center core 149.

A diameter of the center core 149 may be smaller than the diameter of the body 141. The center core 149 is inserted into the rotational mount 150 and is rotatable in the rotational mount 150. The arc bar 140 may rotate when the center core 149 rotates. Gears 149a and 149b may be formed on an outer circumferential surface of the center core 149. A plurality of gears 149a and 149b may be formed on the outer circumferential surface of the center core 149.

Figure 7:
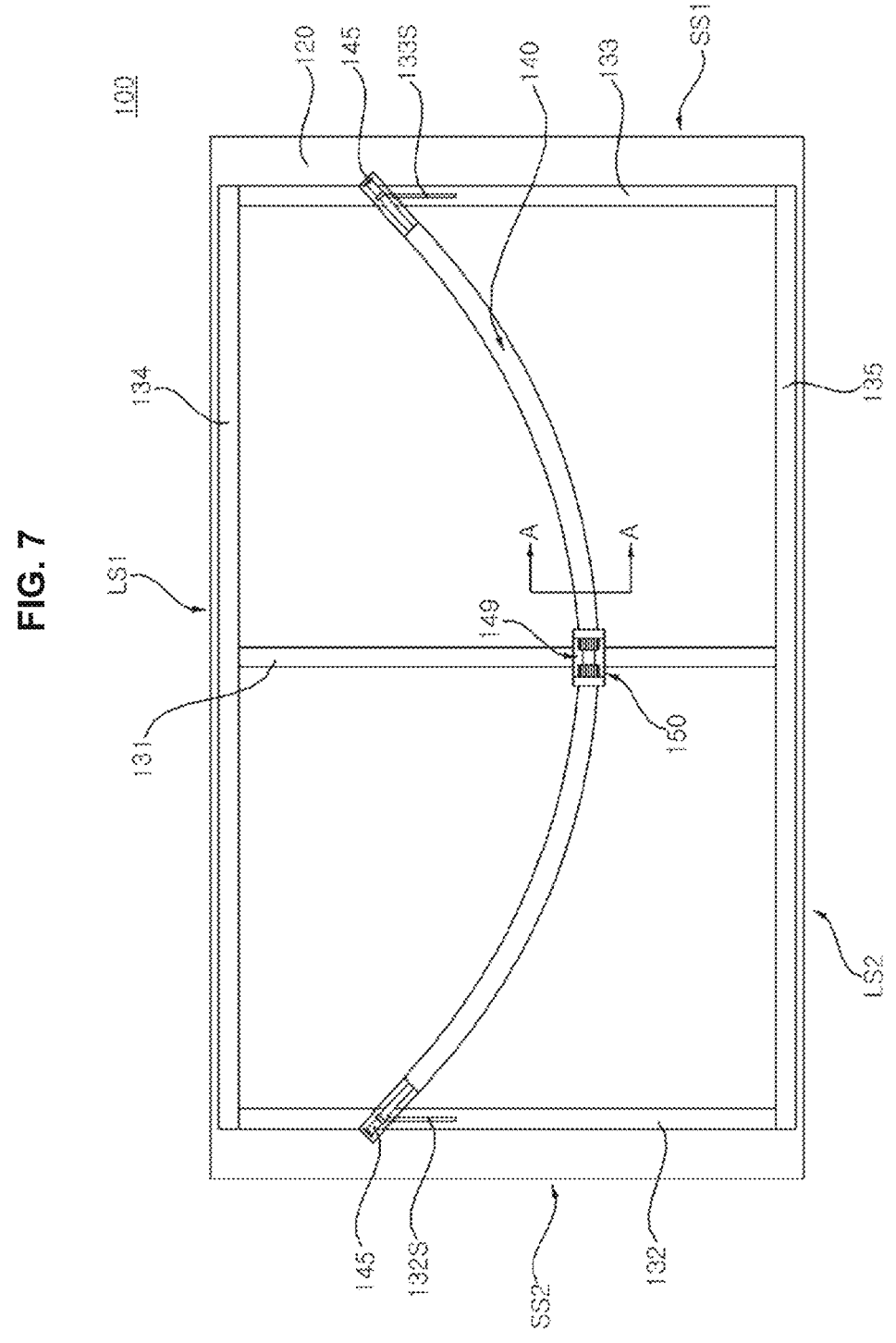
Figure 8:
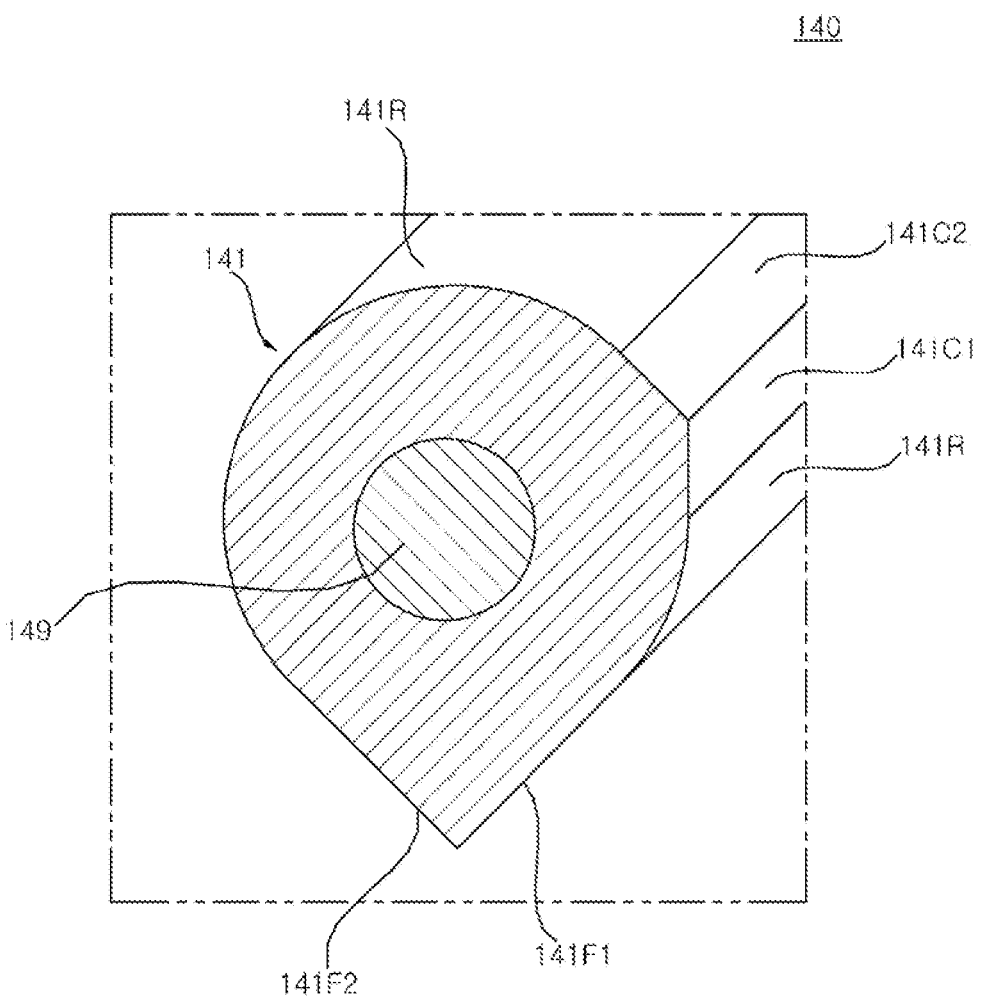

Referring to FIGS. 7 and 8, the center core 149 of the arc bar 140 may form a central axis of the body 141. The body 141 may cover the outside of the center core 149, and the center core 149 may be inserted into the body 141. The body 141 may have a rounded surface 141R. The rounded surface 141R may be a portion of the outer circumferential surface of the body 141.

The body 141 may include a first flat surface 141F1 and a second flat surface 141F2. The first flat surface 141F1 may be in contact with the second flat surface 141F2. As the first flat surface 141F1 is in contact with the second flat surface 141F2, cam surfaces 141F1 and 141F2 protruding from the rounded surface 141R may be provided. For example, the first flat surface 141F1 may form an angle of 60 to 110 degrees with the second flat surface 141F2 with respect to the central axis of the arc bar 140. The first flat surface 141F1 and the second flat surface 141F2 may form a cam (141F1, 141F2).

The body 141 may include a third flat surface 141C1 and a fourth flat surface 141C2. The third flat surface 141C1 may be in contact with the fourth flat surface 141C2. As the third flat surface 141C1 is in contact with the fourth flat surface 141C2, cam surfaces 141C1 and 141C2 protruding from the rounded surface 141R may be provided. For example, the third flat surface 141C1 may form an angle of 90 to 150 degrees with the fourth flat surface 141C2 with respect to the central axis of the arc bar 140. The third flat surface 141C1 and the fourth flat surface 141C2 may form a cam (141C1, 141C2).

A tangent line between the third surface 141C1 and the fourth surface 141C2 may form an angle of 110 to 130 degrees with a tangent line between the first surface 141F1 and the second surface 141F2 with respect to the central axis of the arc bar 140.

Figure 9:
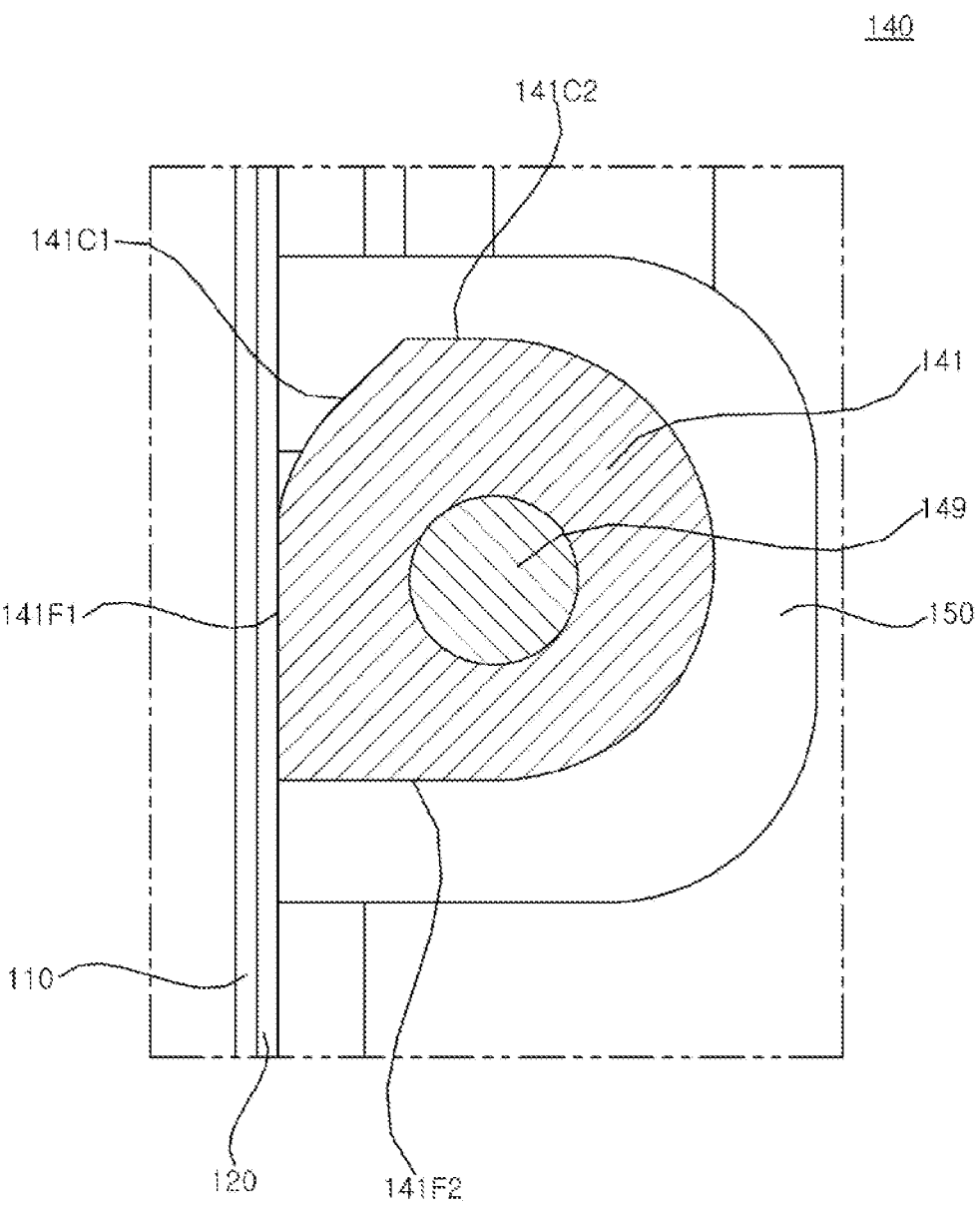
Figure 10:
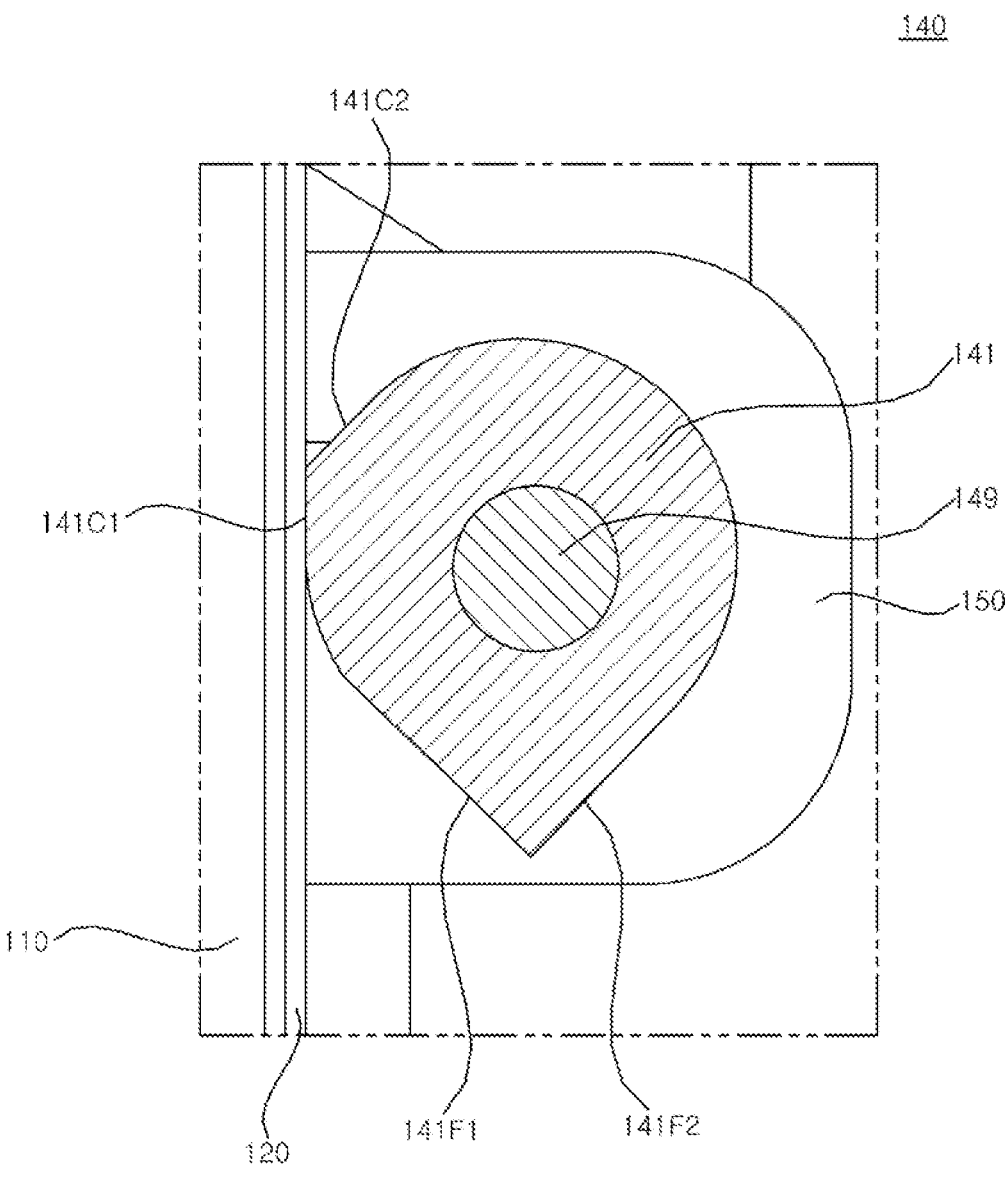

Referring to FIGS. 8 to 10, the arc bar 140 may rotate on the rotational mount 150. If both ends of the arc bar 140 are disposed on the same plane as the center of the arc bar 140 in a vertical direction or a second direction, the first flat surface 141F1 may make contact with a rear surface of the plate 120. The cam formed by the first flat surface 141F1 and the second flat surface 141F2 may allow the arc bar 140 to rotate at a predetermined angle. That is, the cam formed by the first flat surface 141F1 and the second flat surface 141F2 may be a stopper against rotation of the arc bar 140.

As the arc bar 140 rotates when both ends of the arc bar 140 move toward the front of the display device 100, the third flat surface 141C1 may make contact with the rear surface of the plate 120. In this case, the rotation of the arc bar 140 may be limited by the cam formed by the third flat surface 141C1 and the fourth flat surface 141C2. That is, the cam formed by the third flat surface 141C1 and the fourth flat surface 141C2 may be a stopper against rotation of the arc bar 140.

Figure 11:
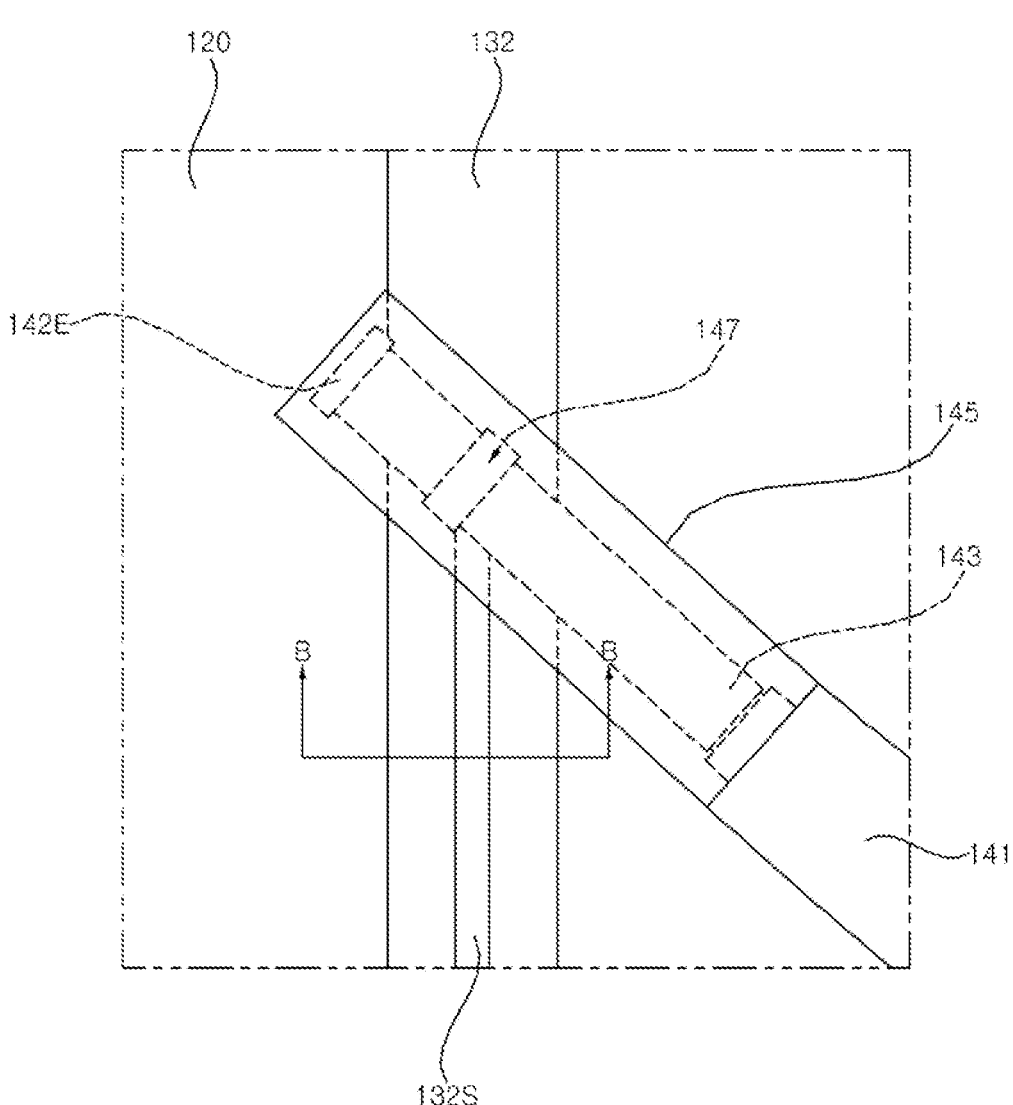
Figure 12:
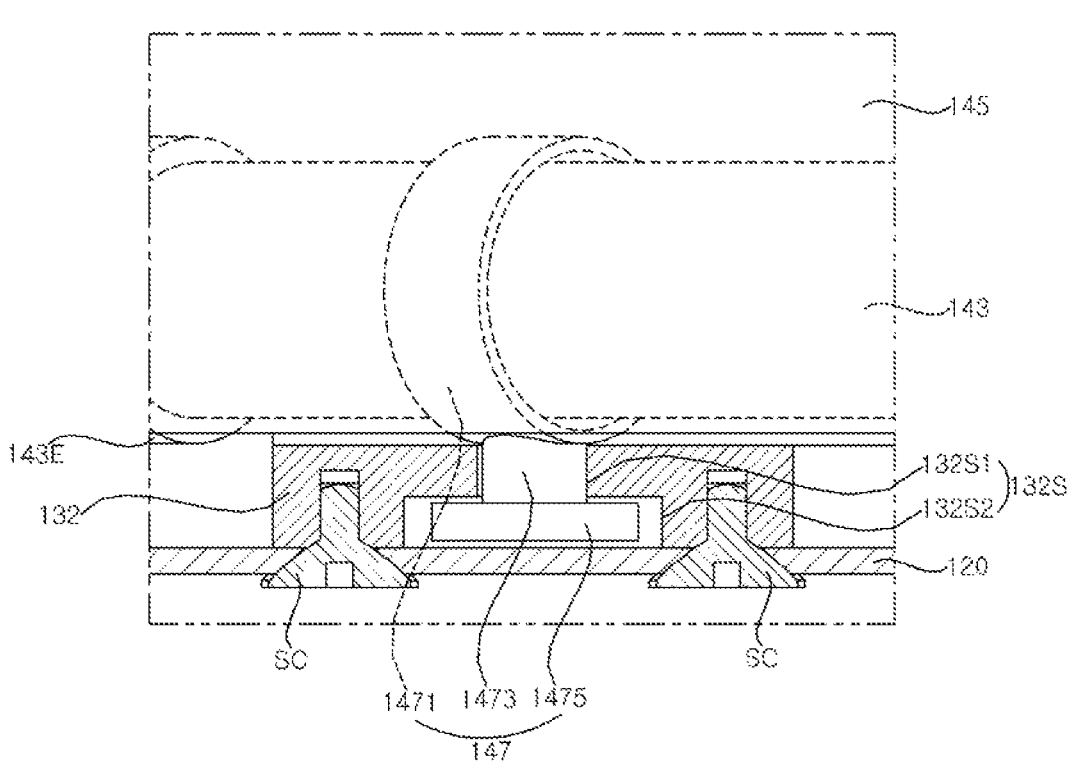

Referring to FIGS. 11 and 12, a slider 147 may include a ring 1471, a neck 1473, and a head 1475. The ring 1471 may have a circular shape. The side core 143 may be inserted into the ring 1471. The ring 1471 may slidably move on the side core 143. The ring 1471 may rub against the side core 143. The neck 1473 may extend from the ring 1471. The neck 1473 may have a cylindrical shape. The neck 1473 may be fixed to an outer circumferential surface of the ring 1471. The head 1475 may be fixed to the neck 1473. The head 1475 may have a disk shape. A diameter of the head 1475 may be greater than a diameter of the neck 1473.

The guide slot 132S2 may have stepped portions 132S1 and 132S2. The guide slot 132S2 may include a first guide slot 132S1 and a second guide slot 132S2. The first guide slot 132S1 may be formed by recessing or removing one surface of the side frame 132 that faces the arc bars 140 and 143. The second guide slot 132S2 may be formed by recessing or removing another surface of the side frame 132 that faces the plate 120. The first guide slot 132S1 and the second guide slot 132S2 may be elongated in a longitudinal direction of the side frame 132. A width of the first guide slot 132S1 may be smaller than a width of the second guide slot 132S2. Accordingly, the stepped portions may be formed at the guide slot 132S.

The second guide slot 132S2 may be formed between the plate 120 and the first guide slot 132S1. The side frame 132 may be fixed to the plate 120 by a fastening member SC. The neck 1473 is movable on the first guide slot 132S1. The head 1475 is movable on the second guide slot 132S2. A diameter of the neck 1473 may be smaller than or substantially equal to the width of the first guide slot 132S1. The diameter of the head 1475 may be greater than the width of the first guide slot 132S1 and may be smaller than the width of the second guide slot 132S2. The slider 147 may be coupled to the side frame 132 to be movable on the side frame 132.

Figure 13:
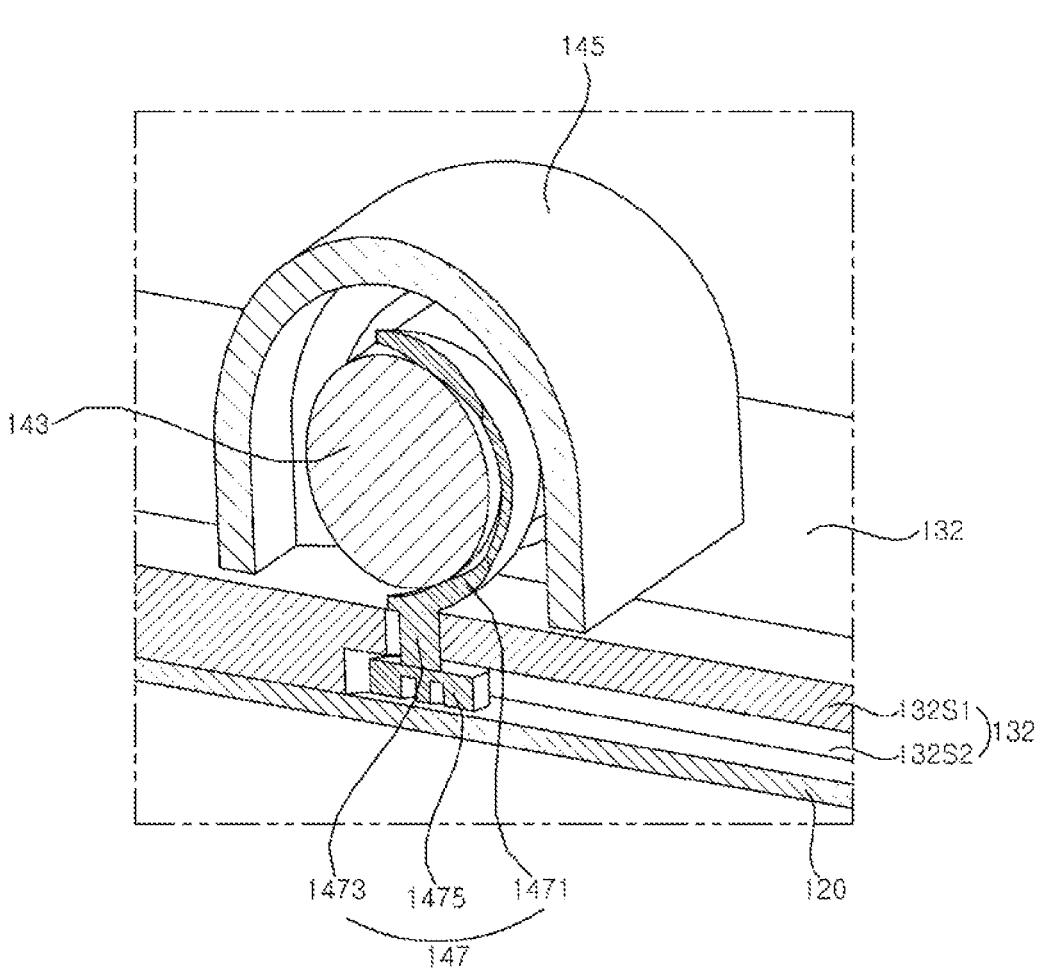
Figure 14:
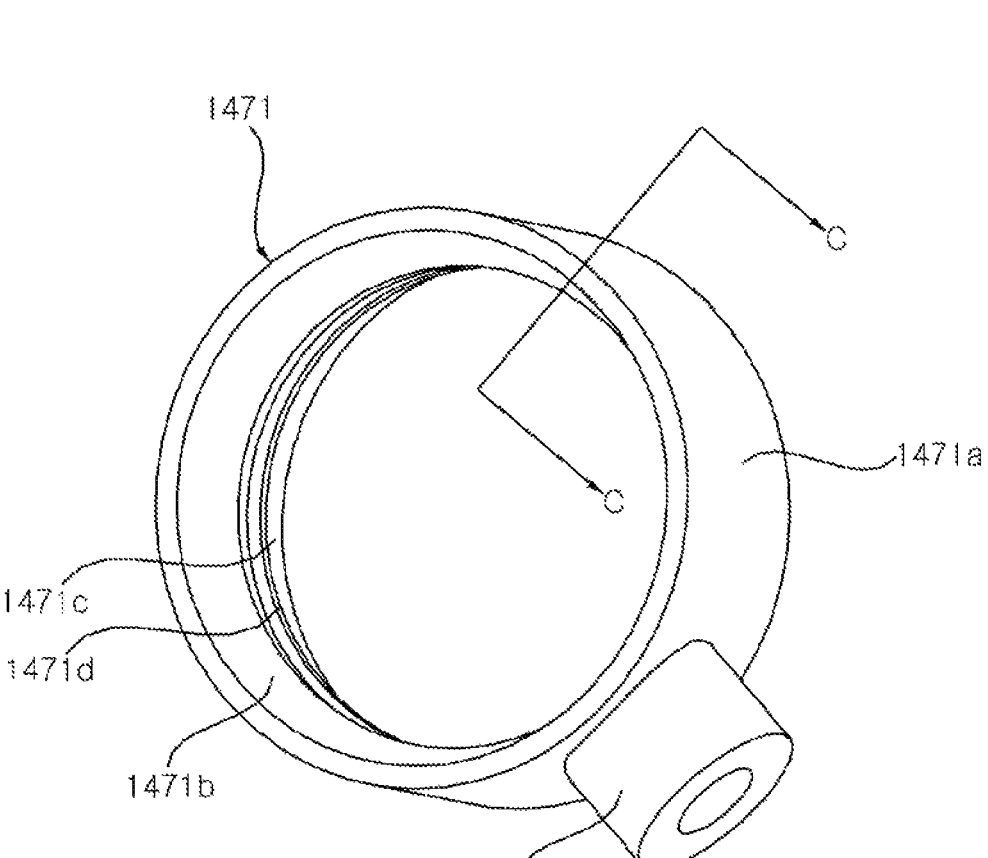
Figure 15:
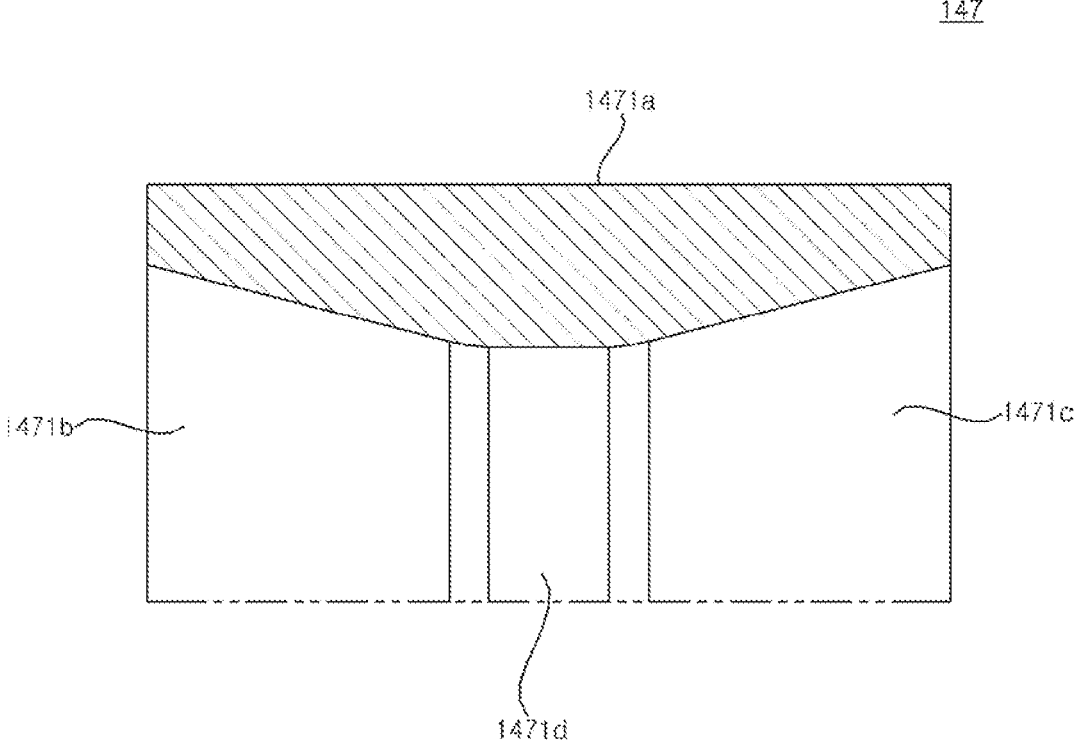

Referring to FIGS. 13 to 15, the neck 1473 may rotate with respect to the head 1475. As the neck 1473 rotates with respect to the head 1475, the ring 1471 may rotate with respect to the head 1475. The neck 1473 may be integrally formed with the ring 1471.

The ring 1471 may include an outer circumferential surface 1471*a*, a first inner circumferential surface 1471*b*, a second inner circumferential surface 1471*c*, and a third inner circumferential surface 1471*d*. The outer circumferential surface 1471*a* may form an outer surface of the ring 1471. The outer circumferential surface 1471*a* may be parallel to a central axis direction of the ring 1471. The first inner circumferential surface 1471*b* may form a portion of an inner surface of the ring 1471. The first inner circumferential surface 1471*b* may be inclined with respect to the outer circumferential surface 1471*a*. The second inner circumferential surface 1471*c* may form a portion of an inner surface of the ring 1471, and may be inclined with respect to the outer circumferential surface 1471*a*.

The third inner circumferential surface 1471*d* may connect the first inner circumferential surface 1471*b* and the second inner circumferential surface 1471*c*. The second inner circumferential surface 1471*c* may be opposite to the first inner circumferential surface 1471*b* with respect to the third inner circumferential surface 1471*d*. An inclination of the second inner circumferential surface 1471*c* may be symmetrical to an inclination of the first inner circumferential surface 1471*b* with respect to the third inner circumferential surface 1471*d*. A curved surface may be formed between the first inner circumferential surface 1471*b* and the third inner circumferential surface 1471*d* and/or between the second inner circumferential surface 1471*c* and the third inner circumferential surface 1471*d*.

Accordingly, while the ring 1471 moves on the side core 143, the ring 1471 may not be caught on the side core 143.

Figure 16:
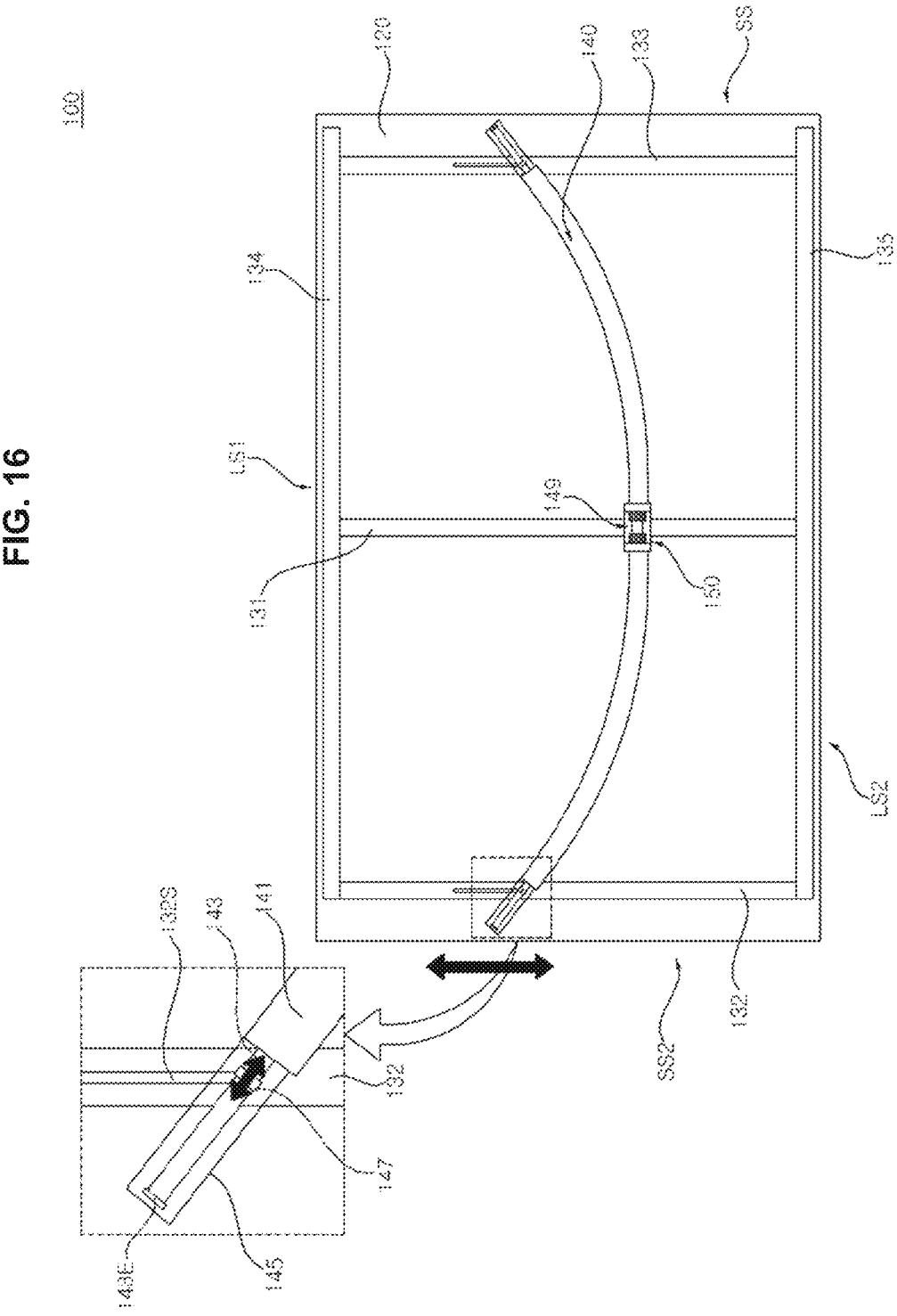
Figure 17:
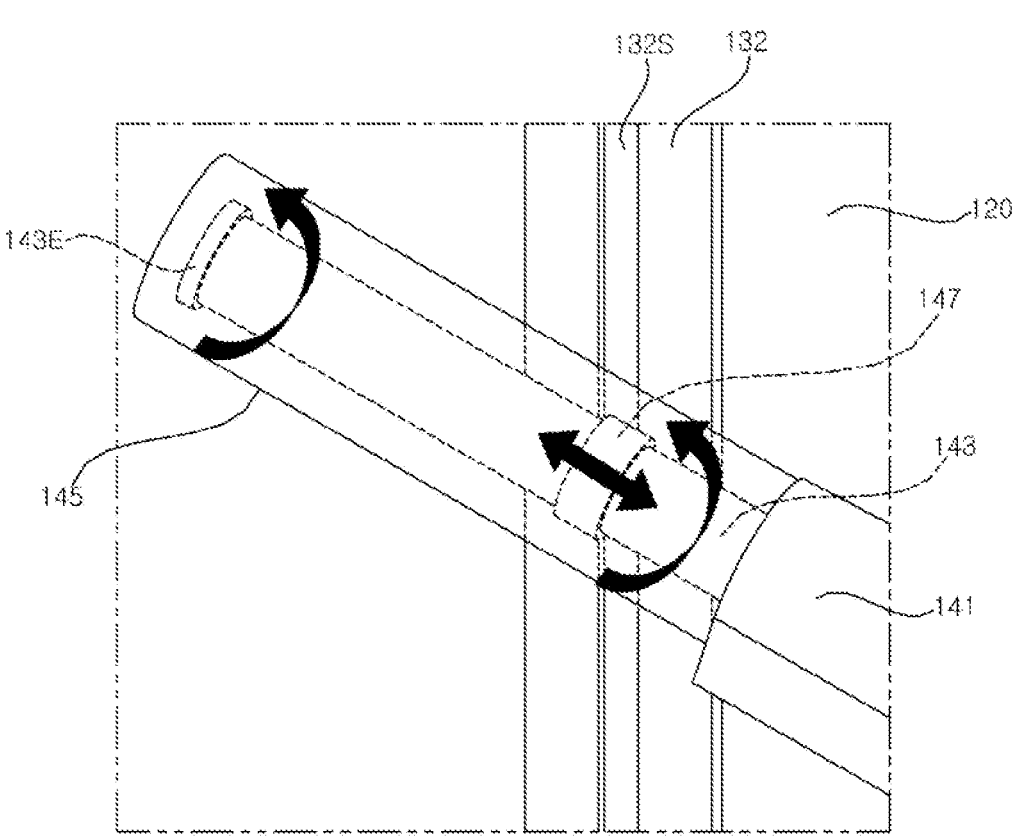

Referring to FIGS. 16 and 17, the arc bar 140 may rotate on the rotational mount 150. When the arc bar 140 rotates on the rotational mount 150 such that both ends of the arc bar 140 move toward the front of the display device 100, the side frames 132 and 133 may move toward the front of the display device 100 with respect to the center frame 131. The plate 120 may move together when the side frames 132 and 133 move. Accordingly, the plate 120 may have a shape that is concave at the front and convex at the rear.

In this case, the slider 147 may move upward and downward on the guide slot 132S of the side frames 132 and 133. For example, when both ends of the arc bar 140 moves toward the front of the display device 100, the slider 147 may move downward on the guide slot 132S. The ring 1471 of the slider 147 may move on the side core 143 from the side end 143E toward the body 141.

Figure 18:
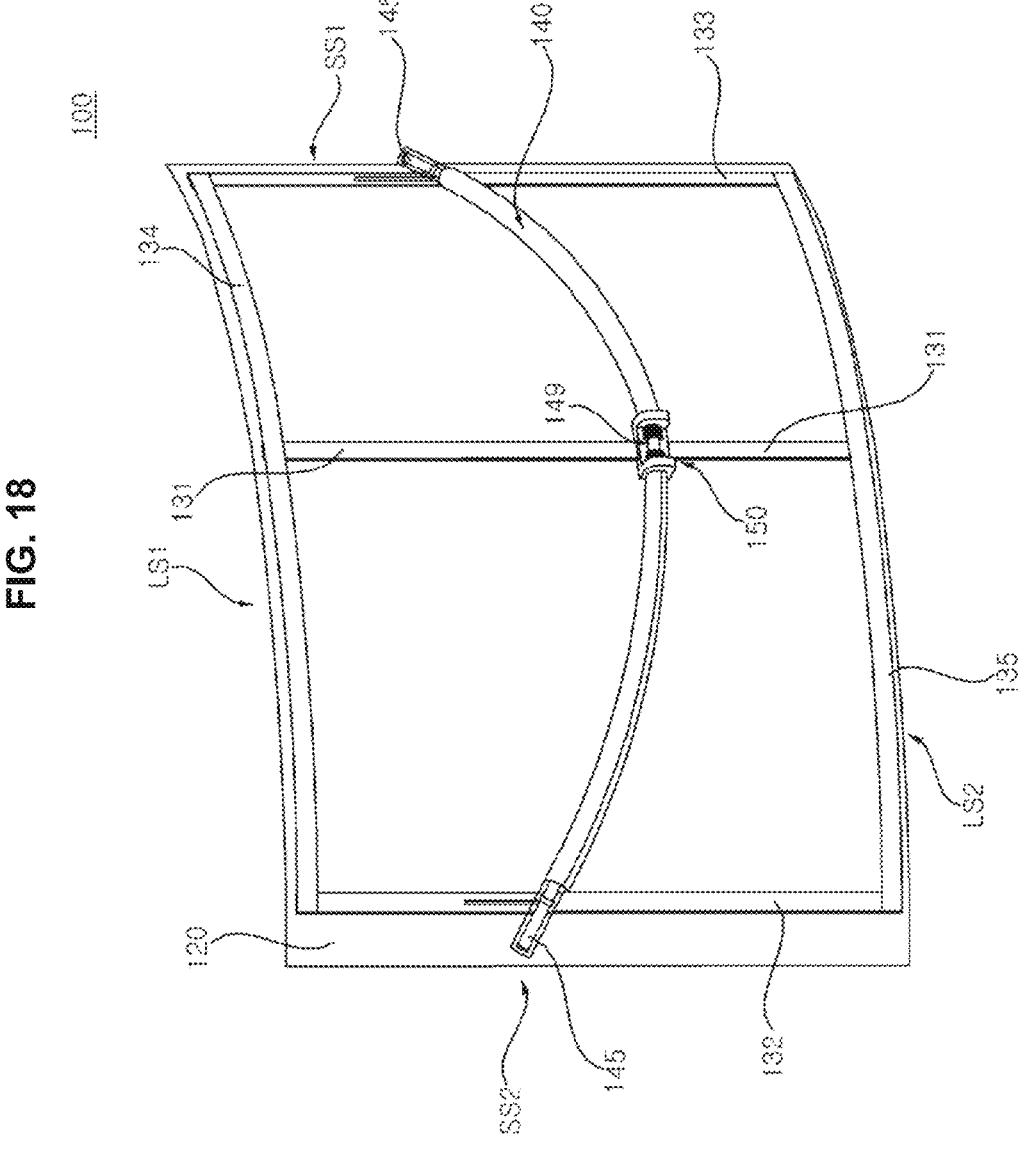
Figure 19:
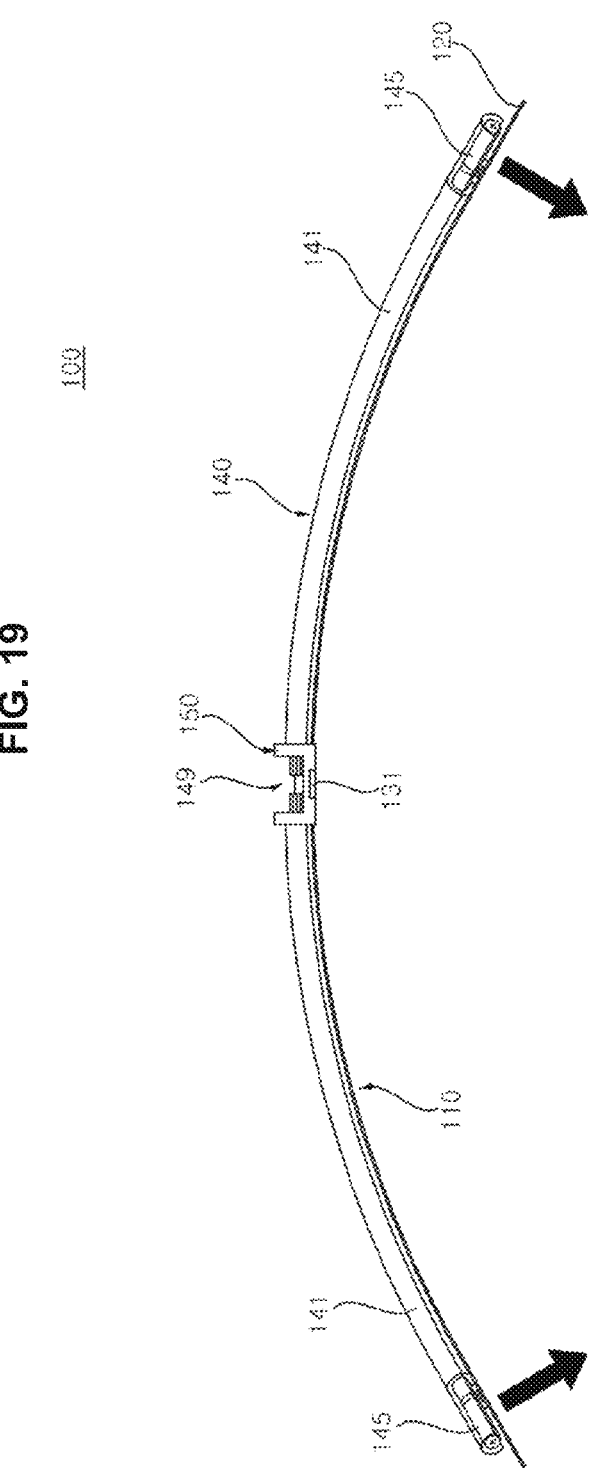
Figure 20:
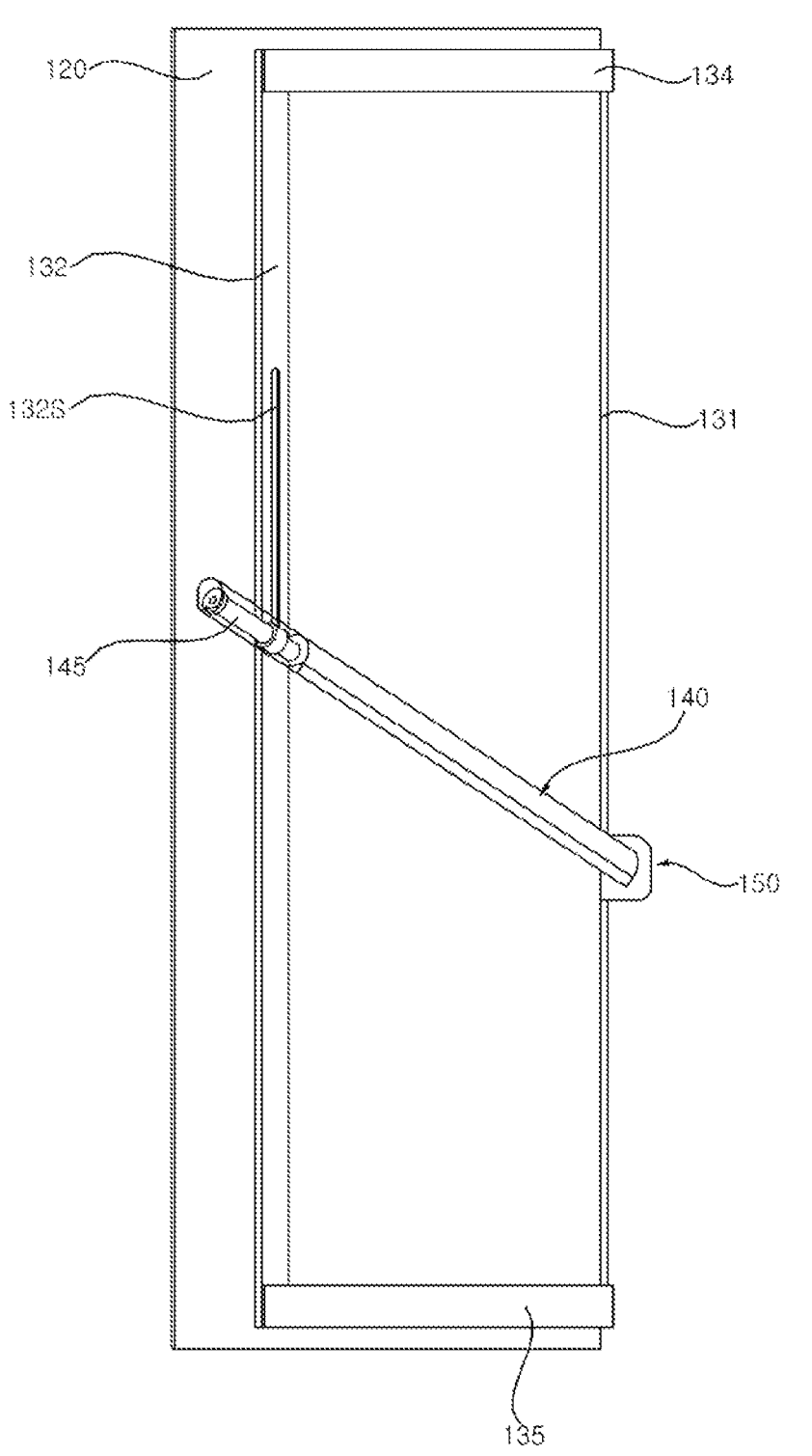

Referring to FIGS. 18 to 20, when the arc bar 140 rotates on the rotational mount 150 such that both ends of the arc bar 140 move toward the front of the display device 100, the plate 120 is curved into a curved shape of the arc bar 140, so as to be curved concavely toward the front of the display device 100.

A curvature of the curved display panel 110 may be changed by rotation of the arc bar 140. A curvature of the display panel 110 when an amount of rotation of the arc bar 140 is small may be greater than a curvature of the display panel 110 when an amount of rotation of the arc bar 140 is large. That is, as the amount of rotation of the arc bar 140 increases when the display panel 110 is in a flat state, the curvature of the display panel 110 may increase.

Referring to FIGS. 1 to 20, a display device includes: a flexible display panel 110; a flexible plate 120 which is disposed at a rear of the display panel 110, and to which the display panel 110 is coupled: a mount 150 fixed to a rear of the plate 120; and a bar 140 curved and elongated, and mounted on the mount to be axially rotatable.

The display device may further include: a first side frame 133 adjacent to a first end of the bar 140 and fixed to the rear of the plate 120; a second side frame 132 adjacent to a second end of the bar 140 and fixed to the rear of the plate 120; a first slider 147 connecting the first side frame 133 and the bar 140; and a second slider 147 connecting the second side frame 132 and the bar 140.

The side frame 132 and 133 may include a guide slot 132S elongated in a direction intersecting the bar 140 and elongated in a longitudinal direction, wherein the slider 147 may include: a ring 1471 into which the bar 140 is inserted: a head 1475 moving on the guide slot 132S; and a neck 1473 connecting the ring 1471 and the head 1475.

The ring 1471 may be fixed to the neck 1473, and the head 1475 may be rotatably coupled to the neck 1473.

The ring 1471 may include: an outer circumferential surface 1471*a*: a first inner circumferential surface 1471*b* inclined with respect to the outer circumferential surface 1471*a*; and a second inner circumferential surface 1471*c* inclined with respect to the outer circumferential surface 1471*a* and symmetrical to the first inner circumferential surface 1471*b* with respect to a circumference of the ring 1471.

The ring 1471 may further include a third inner circumferential surface 1471*d* disposed between the first inner circumferential surface 1471*b* and the second inner circumferential surface 1471*c*, wherein a boundary between the first inner circumferential surface 1471*b* and the third inner circumferential surface 1471*d* may be rounded, and a boundary between the second inner circumferential surface 1471*c* and the third inner circumferential surface 1471*d* may be rounded.

The guide slot 132S may include a first guide slot 132S1 formed by removing one surface of the side frame 132 and 133 facing the bar 140; and a second guide slot 132S2 formed by removing another surface of the side frame 132 and 133 facing the plate 120, wherein a width of the first guide slot 132S1 may be smaller than a width of the second guide slot 132S2.

The head 1475 may be disposed in the second guide slot 132S2, and the neck 1473 may be disposed in the first guide slot 132S2, wherein a diameter of the head 1475 may be greater than a diameter of the neck 1473.

The display panel 110 may include: a first long side LS1 forming an upper side: a second long side LS2 forming a lower side: a first short side SS1 connecting the first long side LS1 and the second long side LS2; and a second short side SS2 facing the first short side SS1 and connecting the first long side LS1 and the second long side LS2, wherein the mount 150 may be closer to the second long side LS2 than the first long side LS1, and both ends of the bar 140 may be closer to the first long side LS1 than the second long side LS2.

The bar 140 may include: a first cam (141F1,141F2) formed on an outer circumferential surface 141R; and a second cam (141C1, 141C2) formed on the outer circumferential surface 141R and circumferentially spaced apart from the first cam (141F1,141F2).

An angle formed between the second cam (141C1, 141C2) and the first cam (141F1,141F2) may be within 180 degrees with respect to a central axis of the bar 140.

As the bar 140 rotates, the display panel 110 may be concavely curved at the front.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

The invention claimed is:

1. A display device comprising:
a flexible display panel;
a flexible plate at a rear of the display panel, the plate coupled with the display panel;
a mount fixed to a rear of the plate;
a bar curved and elongated, and mounted on the mount to be axially rotatable;
a first side frame adjacent to a first end of the bar, the first side frame fixed to the rear of the plate;
a second side frame adjacent to a second end of the bar, the second side frame fixed to the rear of the plate;
a first slider connecting the first side frame and the bar; and
a second slider connecting the second side frame and the bar,
wherein the first side frame comprises a guide slot elongated in a direction intersecting the bar and elongated in a longitudinal direction of the side frame,
wherein the first slider comprises:
a ring into which the bar is inserted;
a head moving on the guide slot; and
a neck connecting the ring and the head, and
wherein the ring is fixed to the neck, and the head is rotatably coupled to the neck.

2. The display device of claim 1, wherein the ring comprises:
an outer circumferential surface;
a first inner circumferential surface inclined with respect to the outer circumferential surface; and a second inner circumferential surface inclined with respect to the outer circumferential surface and symmetrical to the first inner circumferential surface with respect to a circumference of the ring.

3. The display device of claim 2, wherein the ring further comprises:
a third inner circumferential surface disposed between the first inner circumferential surface and the second inner circumferential surface,
wherein a boundary between the first inner circumferential surface and the third inner circumferential surface is rounded, and a boundary between the second inner circumferential surface and the third inner circumferential surface is rounded.

4. The display device of claim 1, wherein the guide slot further comprises:
a first guide slot formed by removing one surface of the side frame facing the bar; and
a second guide slot formed by removing another surface of the side frame facing the plate,
wherein a width of the first guide slot is smaller than a width of the second guide slot.

5. The display device of claim 4, wherein the head is disposed in the second guide slot, and the neck is disposed in the first guide slot,
wherein a diameter of the head is greater than a diameter of the neck.

6. The display device of claim 1, wherein the display panel comprises:
a first long side forming an upper side;
a second long side forming a lower side;
a first short side connecting the first long side and the second long side; and
a second short side facing the first short side and connecting the first long side and the second long side,
wherein the mount is closer to the second long side than the first long side, and both ends of the bar are closer to the first long side than the second long side.

7. The display device of claim 1, wherein bar comprises:
a first cam formed on an outer circumferential surface; and
a second cam formed on the outer circumferential surface and circumferentially spaced apart from the first cam.

8. The display device of claim 7, wherein an angle formed between the second cam and the first cam is within 180 degrees with respect to a central axis of the bar.

9. The display device of claim 1, wherein as the bar rotates, the display panel is concavely curved at a front.

* * * * *